United States Patent
Lee et al.

(10) Patent No.: US 12,437,710 B2
(45) Date of Patent: Oct. 7, 2025

(54) DISPLAY DEVICE HAVING PIXEL CIRCUIT LAYER WITH TRANSISTORS ON DIFFERENT LAYERS

(71) Applicant: Samsung Display Co., LTD., Yongin-si (KR)

(72) Inventors: Ji Hye Lee, Yongin-si (KR); Jin Seon Kwak, Yongin-si (KR); Kyung Bae Kim, Yongin-si (KR); Yong Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/629,851

(22) Filed: Apr. 8, 2024

(65) Prior Publication Data
US 2024/0379049 A1 Nov. 14, 2024

(30) Foreign Application Priority Data
May 11, 2023 (KR) .................. 10-2023-0061186

(51) Int. Cl.
*G09G 3/32* (2016.01)
(52) U.S. Cl.
CPC ....... *G09G 3/32* (2013.01); *G09G 2300/0426* (2013.01)
(58) Field of Classification Search
CPC ........................................ G09G 3/32
USPC ........................................ 345/55
See application file for complete search history.

(56) References Cited

U.S. PATENT DOCUMENTS

| | | | |
|---|---|---|---|
| 9,825,181 B2 | 11/2017 | Tsubuku et al. | |
| 10,818,697 B2 | 10/2020 | Suzuki et al. | |
| 2011/0297944 A1* | 12/2011 | Choi | H01L 29/4908 438/34 |
| 2017/0170326 A1* | 6/2017 | Tsubuku | H01L 29/7869 |
| 2018/0069069 A1* | 3/2018 | Ebisuno | H10K 59/352 |
| 2019/0259331 A1* | 8/2019 | Na | G09G 3/3233 |
| 2021/0125561 A1* | 4/2021 | Choi | H10K 59/87 |
| 2021/0126070 A1* | 4/2021 | Kim | H10K 59/1201 |
| 2022/0208939 A1 | 6/2022 | Kobayashi et al. | |

FOREIGN PATENT DOCUMENTS

| | | |
|---|---|---|
| JP | 4626397 B2 | 2/2011 |
| KR | 10-2022-0092393 A | 7/2022 |

* cited by examiner

*Primary Examiner* — Long D Pham
(74) *Attorney, Agent, or Firm* — Womble Bond Dickinson (US) LLP

(57) ABSTRACT

A display device includes a base layer, a pixel circuit layer on the base layer, the pixel circuit layer including a pixel circuit, and a light emitting layer on the pixel circuit layer, the light emitting layer including a light emitting element electrically connected to the pixel circuit, wherein the pixel circuit layer includes: a lower transistor on the base layer, the lower transistor including a silicon semiconductor, an upper transistor on the lower transistor, the upper transistor including an oxide semiconductor, and an intermediate conductive layer between the lower transistor and the upper transistor, and wherein the intermediate conductive layer includes a data line and a first power line, each of which is electrically connected to the pixel circuit.

20 Claims, 9 Drawing Sheets

UT: T2, T3
LT: T1, T4, T5
C: C1, C2
SC: GW, GC, GB

DISPLAY DEVICE HAVING PIXEL CIRCUIT LAYER WITH TRANSISTORS ON DIFFERENT LAYERS

CROSS-REFERENCE TO RELATED APPLICATION

The present application claims priority to and the benefit of Korean Patent Application No. No. 10-2023-0061186 filed on May 11, 2023, in the Korean Intellectual Property Office, the entire content of which is incorporated by reference herein.

BACKGROUND

1. Technical Field

Aspects of the present disclosure generally relates to a display device.

2. Related Art

The use cases for display devices having high resolution have recently increased. For example, studies on display devices capable of implementing Virtual Reality (VR) and Augmented Reality (AR) have been actively conducted.

To implement a display device having high resolution, it is desirable for components forming the display device to be integrated in a narrow area. To this end, some components of the display device may be sequentially stacked along a vertical direction. However, a defect may occur that a manufacturing process is complicated, and accordingly, manufacturing cost may be increased.

Thus, a structure of a display device may be required, in which components of the display device can be integrated in a relatively narrow area, and a manufacturing process of the display device can be simplified.

The above information disclosed in this Background section is only for enhancement of understanding of the background of the invention and therefore it may contain information that does not form the prior art.

SUMMARY

Aspects of the present disclosure are directed to a display device in which components of the display device can be intensively formed in one area, and a manufacturing process of the display device can be simplified.

According to some embodiments of the present disclosure, there is provided a display device including: a base layer; a pixel circuit layer on the base layer, the pixel circuit layer including a pixel circuit; and a light emitting layer on the pixel circuit layer, the light emitting layer including a light emitting element electrically connected to the pixel circuit, wherein the pixel circuit layer includes: a lower transistor on the base layer, the lower transistor including a silicon semiconductor; an upper transistor on the lower transistor, the upper transistor including an oxide semiconductor; and an intermediate conductive layer between the lower transistor and the upper transistor, and wherein the intermediate conductive layer includes a data line and a first power line, each of which is electrically connected to the pixel circuit.

In some embodiments, the data line and the first power line are at a same layer.

In some embodiments, the data line and the first power line include a same material.

In some embodiments, the intermediate conductive layer electrically connects a first transistor electrode of the upper transistor and a first transistor electrode of the lower transistor to each other.

In some embodiments, the upper transistor includes a plurality of transistors, and at least a portion of the intermediate conductive layer is not electrically connected to a gate electrode of at least one transistor among the plurality of transistors.

In some embodiments, the pixel circuit includes a first transistor, a second transistor, a third transistor, a fourth transistor, and a fifth transistor, the lower transistor includes the first transistor, the fourth transistor, and the fifth transistor, and the upper transistor includes the second transistor and the third transistor.

In some embodiments, the first power line is electrically connected to a first transistor electrode of the first transistor, and the data line is electrically connected to a first transistor electrode of the second transistor.

In some embodiments, the pixel circuit layer includes: a first scan signal line electrically connected to a gate electrode of the second transistor; a second scan signal line electrically connected to a gate electrode of the third transistor; and a third scan signal line electrically connected to a gate electrode of the fifth transistor.

In some embodiments, the first scan signal line and the second scan signal line are on the third scan signal line.

In some embodiments, the first scan signal line and the second scan signal line are at a same layer.

In some embodiments, the intermediate conductive layer is on the third scan signal line, and the first scan signal line and the second scan signal line are on the intermediate conductive layer.

In some embodiments, the pixel circuit layer further includes a capacitor layer in which at least one capacitor is positioned, and the capacitor layer does not include the upper transistor and the lower transistor.

In some embodiments, the capacitor layer includes: a first capacitor conductive layer; a second capacitor conductive layer on the first capacitor conductive layer; a third capacitor conductive layer on the second capacitor conductive layer; and a fourth capacitor conductive layer on the third capacitor conductive layer.

In some embodiments, the display device further includes a second power line on the capacitor layer, the second power line supplying a voltage different from a voltage of the first power line.

According to some embodiments of the present disclosure, there is provided a display device including: a base layer; a pixel circuit layer on the base layer, the pixel circuit layer including a pixel circuit; and a light emitting layer on the pixel circuit layer, the light emitting layer including a light emitting element electrically connected to the pixel circuit, wherein the pixel circuit layer includes: a first layer including a first transistor on the base layer and an intermediate conductive layer including a data line and a first power line, the data and first power lines being on the first transistor; a second layer sharing the intermediate conductive layer in common with the first layer, portions of the second layer being on the first layer and including a second transistor; and a capacitor layer on the second layer, wherein the first transistor includes a silicon semiconductor, and the second transistor includes an oxide semiconductor, and wherein the data line and the first power line are at a same layer.

In some embodiments, the second transistor includes a gate electrode and an active layer, and the gate electrode of the second transistor is a back gate electrode under the active layer of the second transistor.

In some embodiments, the intermediate conductive layer is formed in a same process.

In some embodiments, the pixel circuit layer further includes a second power line includes on the capacitor layer, the second power line supplying a voltage different from a voltage of the first power line, and the second power line is electrically connected to the capacitor layer and the light emitting element.

According to some embodiments of the present disclosure, there is provided a display device including: a light emitting element; a pixel circuit electrically connected to the light emitting element; a first power line electrically connected to the pixel circuit; a second power line electrically connected to the light emitting element; an emission control line electrically connected to the pixel circuit; a scan line electrically connected to the pixel circuit; and a data line electrically connected to the pixel circuit, wherein the pixel circuit includes: a first transistor electrically connected to an anode electrode of the light emitting element and the first power line; a second transistor electrically connected to the data line and a first node; a first capacitor electrically connected to a gate electrode of the first transistor; a second capacitor electrically connected to the first transistor and the second transistor; a third transistor electrically connected to the first transistor and the first node; a fourth transistor electrically connected to the anode electrode of the light emitting element and a second node; and a fifth transistor electrically connected to the fourth transistor, wherein the first transistor, the fourth transistor, and the fifth transistor include a silicon semiconductor, and the second transistor and the third transistor include an oxide semiconductor, wherein the first transistor, the fourth transistor, and the fifth transistor are under the second transistor and the third transistor in a plan view direction, and wherein the first power line and the data line are includes at a same layer.

In some embodiments, the first transistor, the fourth transistor, and the fifth transistor are at a same layer, the second transistor and the third transistor are at a same layer, the first power line and the data line are between a layer at which the first transistor, the fourth transistor, and the fifth transistor are positioned, and a layer at which the second transistor and the third transistor are positioned, the first capacitor and the second capacitor are on the second transistor and the third transistor, and the second power line is on the first capacitor and the second capacitor.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
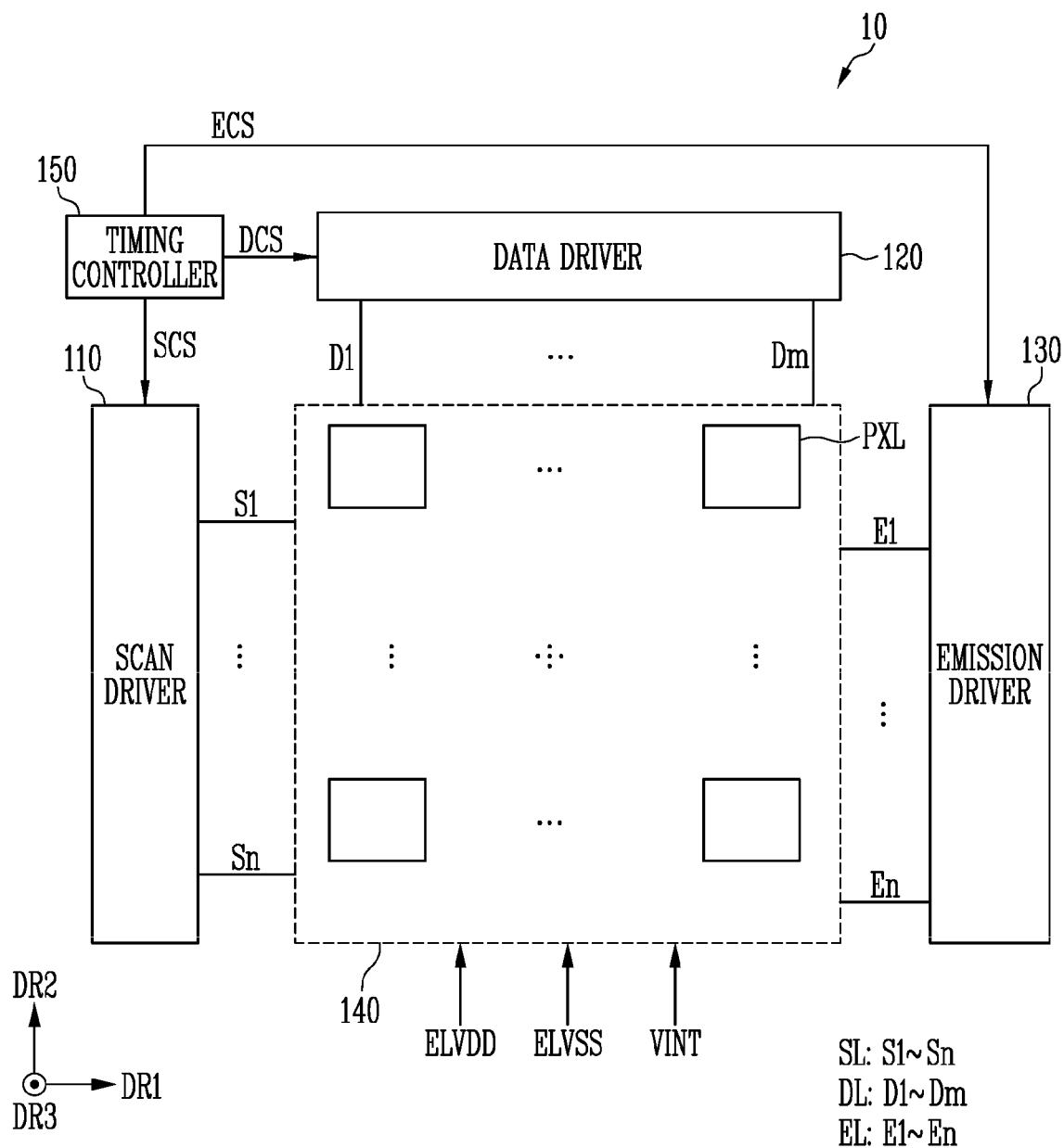
FIG. 1 is a schematic diagram illustrating a display device in accordance with some embodiments of the present disclosure.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art.

Hereinafter, the present invention will be described in detail by explaining exemplary embodiments of the inventive concept with reference to the attached drawings. Like reference numerals in the drawings denote like elements, and their descriptions may not be provided. Sizes of components in the drawings may be exaggerated for convenience of explanation. In other words, because sizes and thicknesses of components in the drawings are arbitrarily illustrated for convenience of explanation, the following exemplary embodiments are not limited thereto.

The present disclosure generally relates to a display device. Hereinafter, a display device in accordance with some embodiments of the present disclosure will be described with reference to the accompanying drawings.

Figure 2:
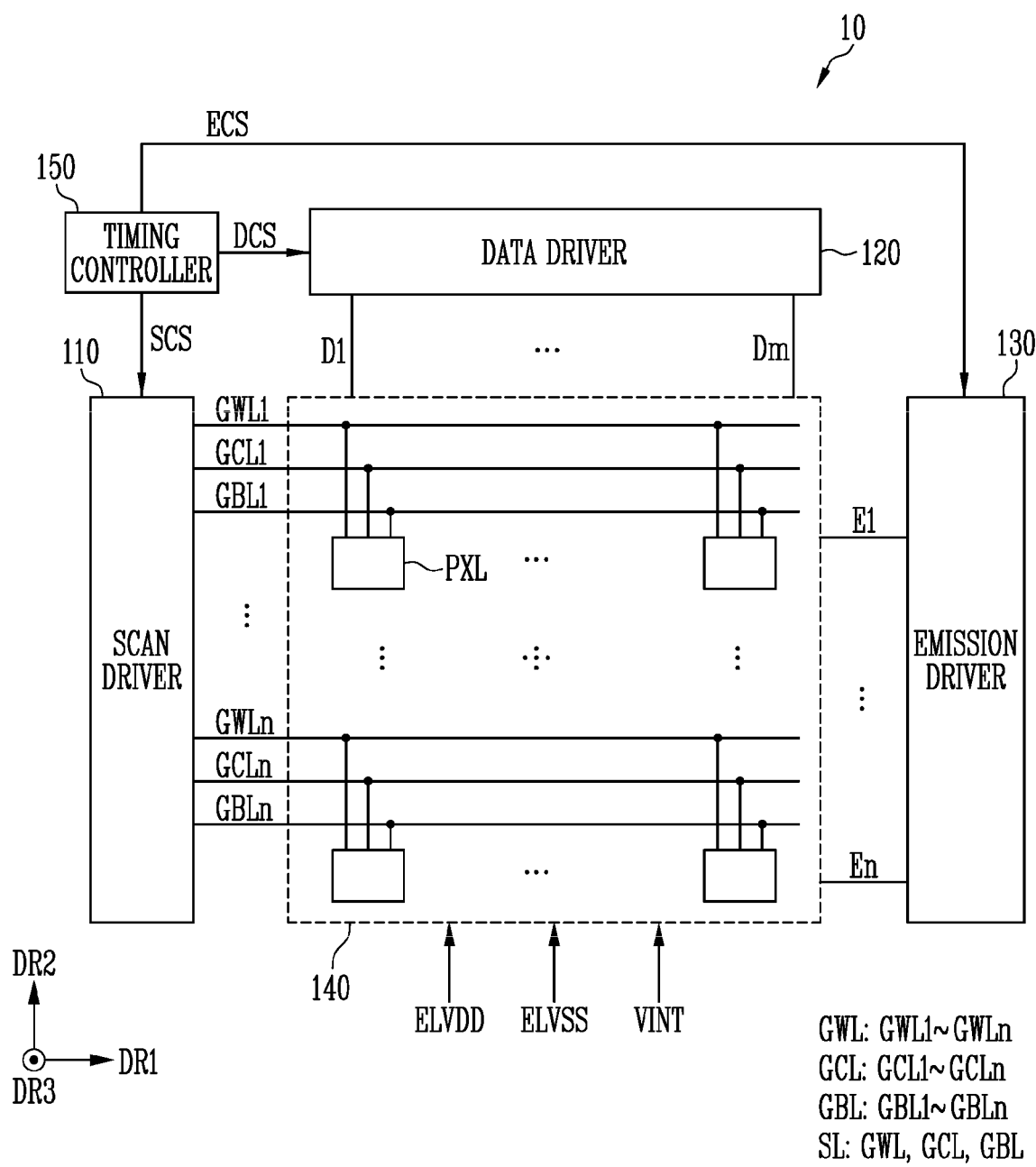
FIG. 2 is a schematic diagram illustrating a scan line shown in FIG. 1, according to some embodiments of the present disclosure.
Figure 3:
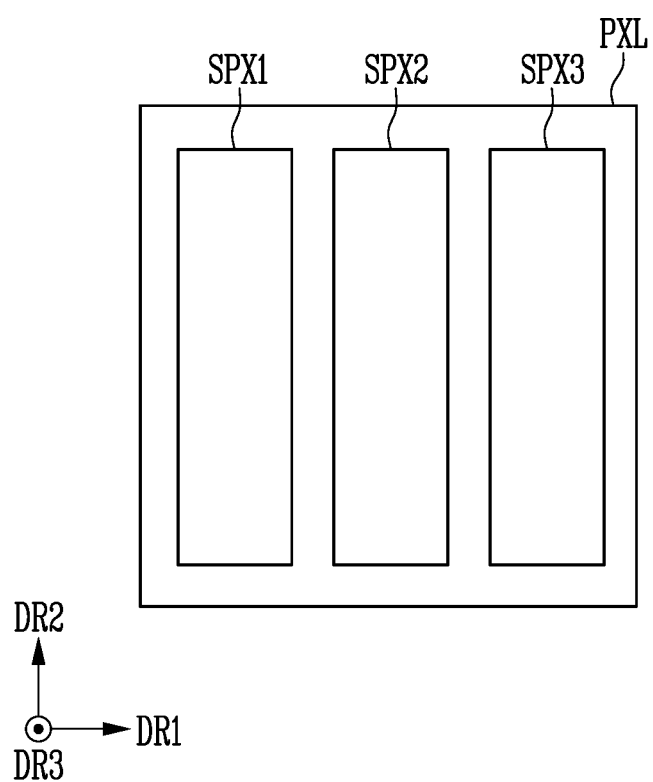
FIG. 3 is a schematic plan view illustrating a pixel in accordance with some embodiments of the present disclosure.

Hereinafter, a display device in accordance with some embodiments of the present disclosure will be described with reference to FIGS. 1 to 3. FIG. 1 is a schematic diagram illustrating a display device in accordance with some embodiments of the present disclosure. FIG. 2 is a schematic diagram illustrating a scan line shown in FIG. 1, according to some embodiments of the present disclosure. FIG. 3 is a schematic plan view illustrating a pixel in accordance with some embodiments of the present disclosure.

The display device 10 may be configured to emit light. The display device 10 may include a scan driver 110, a data driver 120, an emission driver 130, a pixel unit 140, and a timing controller 150.

The display device 10 may further include a first power source ELVDD, a second power source ELVSS, a third power source VINT, scan lines SL and emission control lines EL, which extend in a first direction DR1, and data lines DL extending in a second direction DR2 intersecting the first direction DR1.

The scan lines SL may include first to nth scan lines S1 to Sn. In some embodiments, the scan lines SL may include a plurality of lines which can be electrically connected to one pixel PXL. For example, the scan lines SL may include a first scan signal line GWL, a second scan signal line GCL, and a third scan signal line GBL as shown in FIG. 2.

In some embodiments, scan lines SL of adjacent pixel rows overlap with each other or are shared with one another. For example, one scan line SL may form one of scan lines SL of another adjacent pixel row.

In some embodiments, at least some of scan lines SL connected to an (i+1)th (i is a natural number) pixel row are the same as at least some of scan lines SL connected to an ith pixel row. For example, one of the scan lines of the (i+1)th pixel row may be the same as one of the scan lines of the ith pixel row. An (i+1)th first scan signal line GWL may be an ith second scan signal line GCL. However, the present disclosure is not limited thereto, and, in some examples, the (i+1)th first scan signal line GWL may be an ith third scan signal line GBL or an ith first scan signal line GWL.

Besides, in some embodiments, at least some of first to third scan lines GWL, GCL, and GBL in one pixel row may be formed by the same line. However, the present disclosure is not limited thereto, and each of first to third scan lines GWL, GCL, and GBL in one pixel row may be formed by different lines.

The emission control lines EL may include first to nth emission control lines E1 to En.

The data lines DL may include first to mth data lines D1 to Dm.

The display device 10 may include pixels PXL electrically connected to the scan lines SL, the emission control lines EL the data lines DL, the first power source ELVDD, the second power source ELVSS, and the third power source VINT. The pixels PXL may be disposed in the pixel unit 140.

Herein, the first direction DR1 may be a row direction of the pixel, the second direction DR2 may be a column direction of the pixel, and a third direction DR3 may be a thickness direction of the display device 10.

For convenience of description, a specific connection relationship between the pixels PXL, and the scan lines SL, the emission control lines EL, and the data lines DL in the pixel unit 140 is omitted in FIG. 1.

The timing controller 150 may acquire (or generate) a data driver control signal DCS, a scan driver control signal SCS, and an emission driver control signal ECS, based on an input control signal input to the timing controller 150.

The timing controller 150 may generate the scan driver control signal SCS for controlling an operation of the scan driver 110, based on the input control signal, and output the scan driver control signal SCS to the scan driver 110.

The timing controller 150 may generate the data driver control signal DCS for controlling an operation of the data driver 120, based on the input control signal, and output the data driver control signal DCS to the data driver 120.

The timing controller 150 may generate the emission driver control signal ECS for controlling an operation of the emission driver 130, based on the input control signal, and output the emission driver control signal ECS to the emission driver 130.

The scan driver 110 may supply scan signals SC (e.g., see FIG. 4) to the scan lines SL, based on the scan driver control signal SCS provided from the timing controller 150.

For example, the scan driver 110 may sequentially supply scan signals to the scan lines SL. The scan driver 110 may supply a first scan signal GW (e.g., see FIG. 4) through the first scan signal line GWL. The scan driver 110 may supply a second scan signal GC (e.g., see FIG. 4) through the second scan signal line GCL. The scan driver 110 may supply a third scan signal GB (e.g., see FIG. 4) through the third scan signal line GBL. When the scan signals SC are sequentially supplied to the scan lines SL, the pixels PXL may be sequentially selected in units of horizontal lines. The scan signal SC may have a voltage level at which transistors T2, T3, and T5 supplied with (e.g., see FIG. 4) supplied with the scan signal SC can be turned on.

The emission driver 130 may supply emission control signals EM (e.g., see FIG. 4) to the emission control lines EL, based on the emission driver control signal ECS provided from the timing controller 150.

For example, the emission driver 130 may sequentially supply the emission control signals EM to the emission control lines EL. The emission control signal EM may have a voltage level at which a fourth transistor T4 (e.g., see FIG. 4) supplied with the emission control signal can be turned off.

The data driver 120 may supply data signals to the data lines DL, based on the data driver control signal DCS provided from the timing controller 150.

The data signals supplied to the data lines DL may be supplied to pixels PXL selected by each scan signal. To this end, the data driver 120 may supply the data signals to the data lines DL in synchronization with the scan signals SC.

The pixels PXL may be supplied with the scan signals SC from the scan lines SL, and be supplied with the data signals synchronized with the scan signals SC from the data lines DL.

Each of the pixels PXL supplied with the data signals may control an amount of driving current flowing from the first power source ELVDD to the second power source ELVSS via a light emitting element LD (e.g., see FIG. 4), and the light emitting element LD may generate light with a luminance corresponding to the amount of driving current.

The light emitting element LD may be provided in various suitable forms. For example, the light emitting element LD may be an inorganic light emitting element including an inorganic material. In some embodiments, the light emitting element LD may be an organic light emitting diode. However, the present disclosure is not limited to a specific example. For example, the light emitting element LD may be an inorganic light emitting element including an inorganic semiconductor, and may be a flip chip-type micro Light Emitting Diode (LED).

Referring to FIG. 3, each of the pixels PXL may include a plurality of sub-pixels SPX1, SPX2, and SPX3. In FIG. 3, it has been exemplified that each of the pixels PXL includes a first sub-pixel SPX1, a second sub-pixel SPX2, and a third sub-pixel SPX3. However, embodiments of the present disclosure are not limited thereto.

The first sub-pixel SPX1, the second sub-pixel SPX2, and the third sub-pixel SPX3 may be connected to any one of the data lines DL and at least one of the scan lines SL.

Each of the first sub-pixel SPX1, the second sub-pixel SPX2, and the third sub-pixel SPX3 may have various suitable shapes. For example, each of the first sub-pixel SPX1, the second sub-pixel SPX2, and the third sub-pixel SPX3 may have a quadrangular shape. However, embodiments of the present disclosure are not limited thereto.

The first sub-pixel SPX1 may emit first light, the second sub-pixel SPX2 may emit second light, and the third sub-pixel SPX3 may emit third light. The first light may be light in a red wavelength band, the second light may be light in a green wavelength band, and the third light may be light in a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm. However, embodiments of the present disclosure are not limited thereto.

Each of the first sub-pixel SPX1, the second sub-pixel SPX2, and the third sub-pixel SPX3 may include a light emitting element LD configured to emit light. For example, the light emitting elements LD included in the sub-pixels SPX1, SPX2, and SPX3 may emit lights of different colors. However, embodiments of the present disclosure are not limited thereto. In some embodiments, the light emitting elements LD included in the sub-pixels SPX1, SPX2, and SPX3 may emit lights of the same color, and a color filter and/or a quantum-dot layer may be further included to implement the sub-pixels SPX1, SPX2, and SPX3 emitting lights of different colors.

Figure 4:
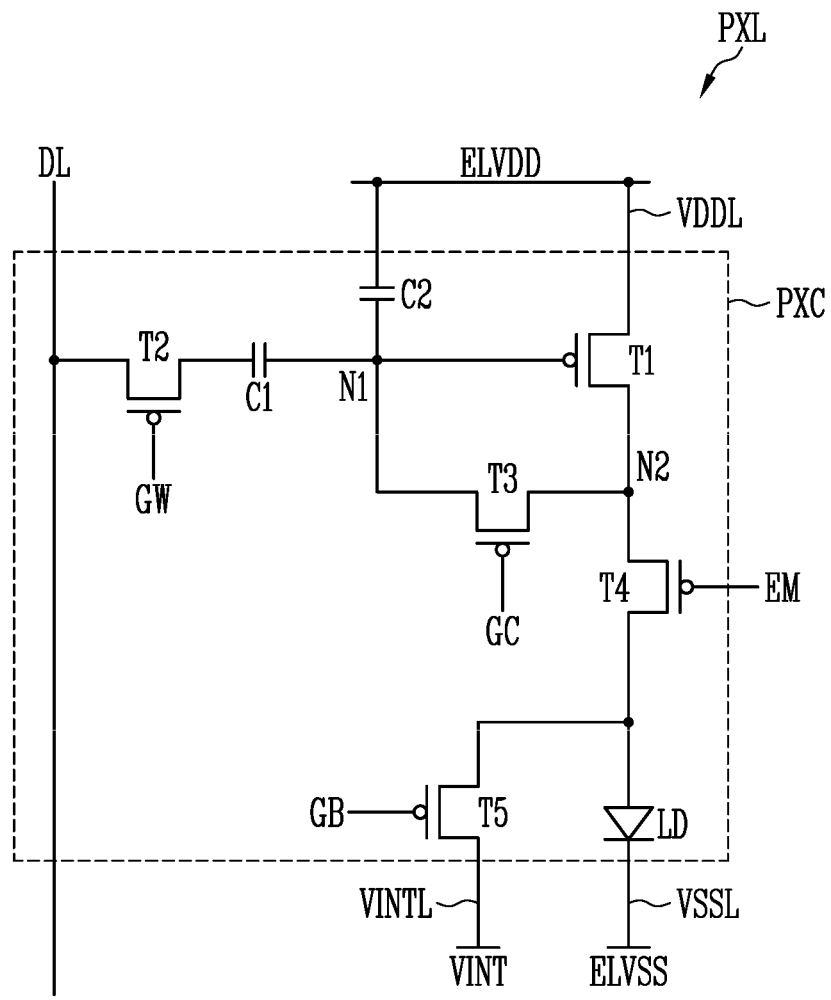
FIG. 4 is a schematic diagram illustrating a pixel circuit included in a pixel in accordance with some embodiments of the present disclosure.

FIG. 4 is a schematic diagram illustrating a pixel circuit included in a pixel in accordance with some embodiments of the present disclosure.

For convenience, a pixel PXL disposed on an ith (i is a natural number) row and a jth (j is a natural number) of the pixel unit 140 is illustrated in FIG. 4. Hereinafter, for convenience of description, in embodiments in which a pixel circuit PXC for driving the pixel PXL includes five transistors T1 to T5 and two storage capacitors will be mainly described. However, embodiments of the present disclosure are not limited thereto, and the number of circuit elements, and the like may be changed.

Referring to FIG. 4, the pixel PXL may include a pixel circuit PXC, a first power line VDDL, a second power line VSSL, a third power line VINTL, an emission control line EL, a scan line SL, a data line DL, and a light emitting element LD.

The pixel circuit PXC may include an upper transistors UT, a lower transistor LT, and capacitors C. The upper transistors UT may include a second transistor T2 and a third transistor T3. The lower transistors LT may include a first transistor T1, a fourth transistor T4, and a fifth transistor T5. The capacitors C may include a first capacitor C1 and a second capacitor C2.

The pixel circuit PXC may be electrically connected to the first power line VDDL, the second power line VSSL, the third power line VINTL, the emission control line EL, the scan line SL, and the data line DL.

The first transistor T1 (e.g., a driving transistor) may include a gate electrode electrically connected to a first node N1, a first transistor electrode electrically connected to the first power source ELVDD (e.g., a high power voltage source) through the first power line VDDL, and a second transistor electrode electrically connected to a second node N2.

Hereinafter, a case where each of the first to fifth transistors T1 to T5 is a p-channel metal oxide semiconductor (PMOS) transistor, and first and second transistor electrodes are respectively source and drain electrodes will be mainly described. However, embodiments of the present disclosure are not limited thereto. In some embodiments, when each of the first to fifth transistors T1 to T5 is an n-channel metal oxide semiconductor (NMOS) transistor, the first transistor electrode may be the drain electrode, and the second transistor electrode are the source electrode.

When the first to fifth transistors T1 to T5 is implemented with a PMOS transistor, a low voltage level may be an activation level, and a high voltage level may be an inactivation level. For example, when a signal applied to a control electrode of the PMOS transistor has the low voltage level, the PMOS transistor may be turned on. When a signal applied to the control electrode of the PMOS transistor has the high voltage level, the PMOS transistor may be turned off. The PMOS transistor may be electrically connected to another component.

An anode electrode of the light emitting element LD may be electrically connected to the first transistor T1 via the fourth transistor T4, and a cathode electrode of the light emitting element LD may be electrically connected through the second power source ELVSS (e.g., a low power voltage source) and the second power line VSSL. The light emitting element LD may emit light with a luminance corresponding to a current amount supplied from the first transistor T1. A voltage value of the first power source ELVDD may be set higher than a voltage value of the second power source ELVSS such that a current can flow through the light emitting element LD.

The second transistor T2 may include a gate electrode receiving a first scan signal GW, a first transistor electrode electrically connected to the data line DL, and a second transistor electrode electrically connected to a first capacitor electrode of the first capacitor C1. In some embodiments, the first scan signal GW is a write scan signal. However, embodiments of the present disclosure are not limited thereto.

The first capacitor C1 may include the first capacitor electrode electrically connected to the second transistor T2 and a second capacitor electrode electrically connected to the first node N1.

The third transistor T3 may include a gate electrode receiving a second scan signal GC, a first transistor electrode electrically connected to the first node N1, and a second transistor electrode electrically connected to the second node N2. In some embodiments, the second scan signal GC may be a scan compensation signal. However, embodiments of the present disclosure are not limited thereto.

The second capacitor C2 may include a first capacitor electrode electrically connected to the first power source ELVDD and a second capacitor electrode electrically connected to the first node N1.

The fourth transistor T4 may include a gate electrode receiving an emission control signal EM, a first transistor electrode electrically connected to the second node N2, and a second transistor electrode electrically connected to the anode electrode of the light emitting element LD.

The light emitting element LD may include the anode electrode electrically connected to the second transistor electrode of the fourth transistor T4 and the cathode electrode receiving the second power source ELVSS (e.g., the low power voltage source).

The fifth transistor T5 may include a gate electrode receiving a third scan signal GB, a first transistor electrode electrically connected to the third power source VINT, and a second transistor electrode electrically connected to the fourth transistor T4. In some embodiments, the third scan signal GB is a bypass signal, and the third power source VINT is a ground voltage.

Figure 5:
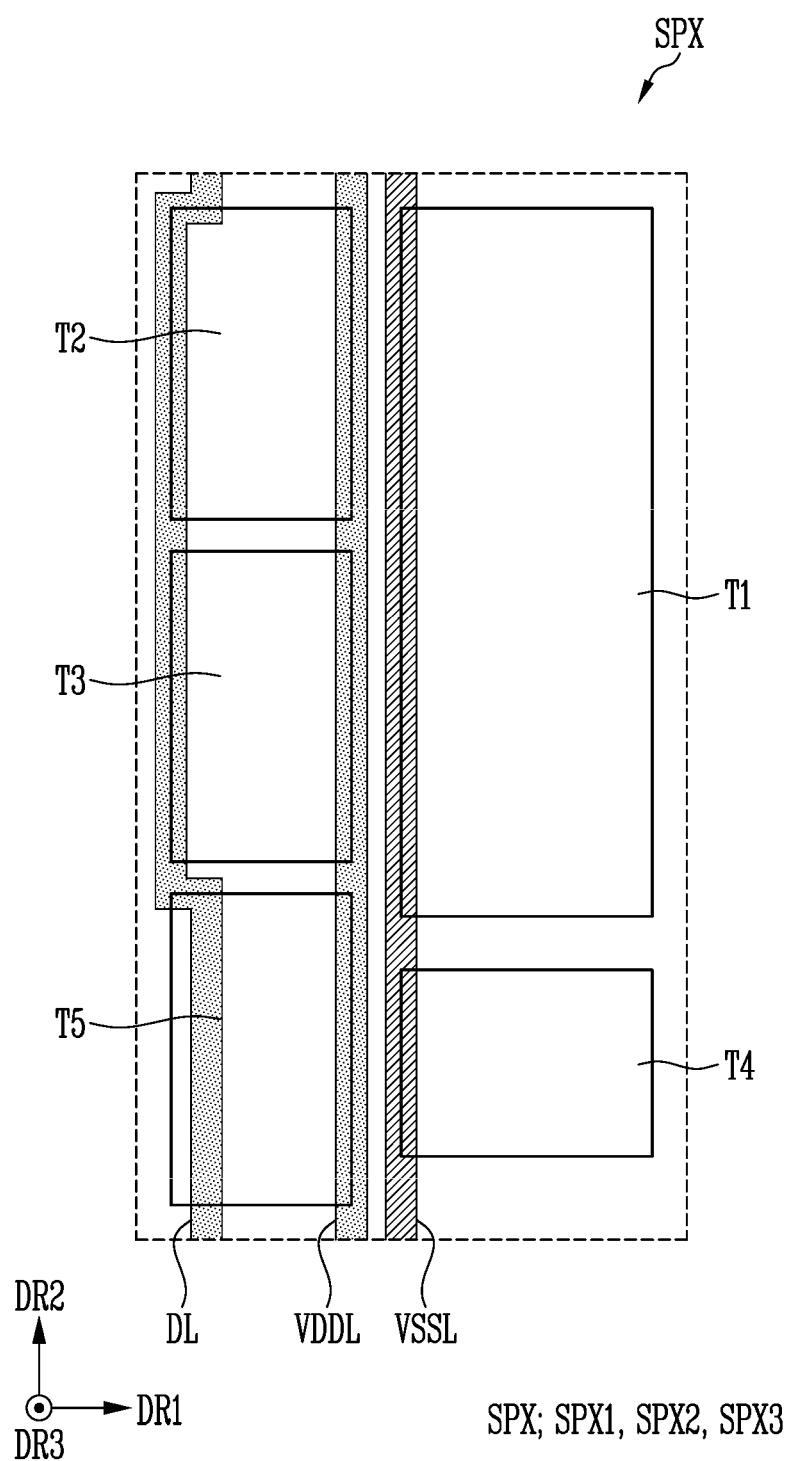
FIG. 5 is a schematic view illustrating a sub-pixel in accordance with some embodiments of the present disclosure.

FIG. 5 is a schematic view illustrating a sub-pixel in accordance with some embodiments of the present disclosure. FIG. 5 may be a plan view illustrating areas in which transistors T1 to T5 can be disposed in the sub-pixel SPX shown in FIG. 3. FIG. 5 may be a view illustrating an arrangement relationship between the transistors T1 to T5, and the data line DL, the first power line VDDL, and the second power line VSSL, which are also shown in FIG. 4.

Referring to FIG. 5, the sub-pixel SPX may include first to fifth transistors T1 to T5. In FIG. 5, components except the transistors T1 to T5, the data line DL, the first power line VDDL, and the second power line VSSL are not illustrated such that the arrangement relationship between the transistors T1 to T5, and the data line DL, the first power line VDDL, and the second power line VSSL is more clearly expressed.

In a plan view, the first transistor T1 may be disposed in one area in which the sub-pixel SPX is formed. In a plan view, the second transistor T2 may be adjacent to the first transistor T1 in a pixel row direction (e.g., the first direction DR1). In a plan view, the third transistor T3 may be adjacent to the first transistor T1 in the pixel row direction, and be adjacent to the second transistor T2 in a pixel column direction (e.g., the second direction DR2). In a plan view, the fourth transistor T4 may be adjacent to the first transistor T1 in the pixel column direction. In a plan view, the fifth transistor T5 may be adjacent to the fourth transistor T4 in the pixel row direction, and be adjacent to the third transistor T3 in the pixel column direction.

The data line DL may roughly extend in the pixel column direction. The first power line VDDL may at least partially overlap with the second transistor T2, the third transistor T3, and the fifth transistor T5 in a plan view.

The first power line VDDL may roughly extend in the pixel column direction. The first power line VDDL may at least partially overlap with the second transistor T2, the third transistor T3, and the fifth transistor T5 in a plan view.

In some embodiments, the data line DL and the first power line VDDL is disposed at the same layer. The data line DL and the first power line VDDL may be disposed at the same layer, and be electrically connected to a first transistor electrode of an upper transistors UT and a second transistor electrode of a lower transistor LT.

However, embodiments of the present disclosure are not limited thereto. The data line DL and the first power line VDDL may be electrically connected to a second transistor electrode of the upper transistors UT and a first transistor electrode of the lower transistor LT.

The data line DL and the first power line VDDL may be formed in the same process. For example, the data line DL and the first power line VDDL may be deposited using the same or substantially the same material. In some embodiments, the data line DL and the first power line VDDL are formed in the same process, so that a process step can be simplified.

In some embodiments, the data line DL and the first power line VDDL include the same conductive material. For example, the conductive material may include at least one of aluminum (Al), tungsten (W), titanium (Ti), or copper (Cu).

The data line DL and the first power line VDDL may be deposited through the same deposition process, and be etched through the same etching process. The deposition process may include a Physical Vapor Deposition (PVD) process (e.g., a sputtering process or the like), a Chemical Vapor Deposition (CVD) process, an Atomic Layer Deposition (ALD) process, and the like. The etching process may include wet etching, dry etching, and/or the like. However, embodiments of the present disclosure are not limited to a specific example.

The second power line VSSL may roughly extend in the pixel column direction. The second power line VSSL may at least partially overlap with the first transistor T1 and the fourth transistor T4 in a plan view.

The second power line VSSL may be formed in a process different from the process of forming the data line DL and the first power line VDDL. For example, after the data line DL and the first power line VDDL are formed, the second power line VSSL may be formed. The second power line VSSL may be disposed on the data line DL and the first power line VDDL. However, embodiments of the present disclosure are not limited thereto.

Figure 6:
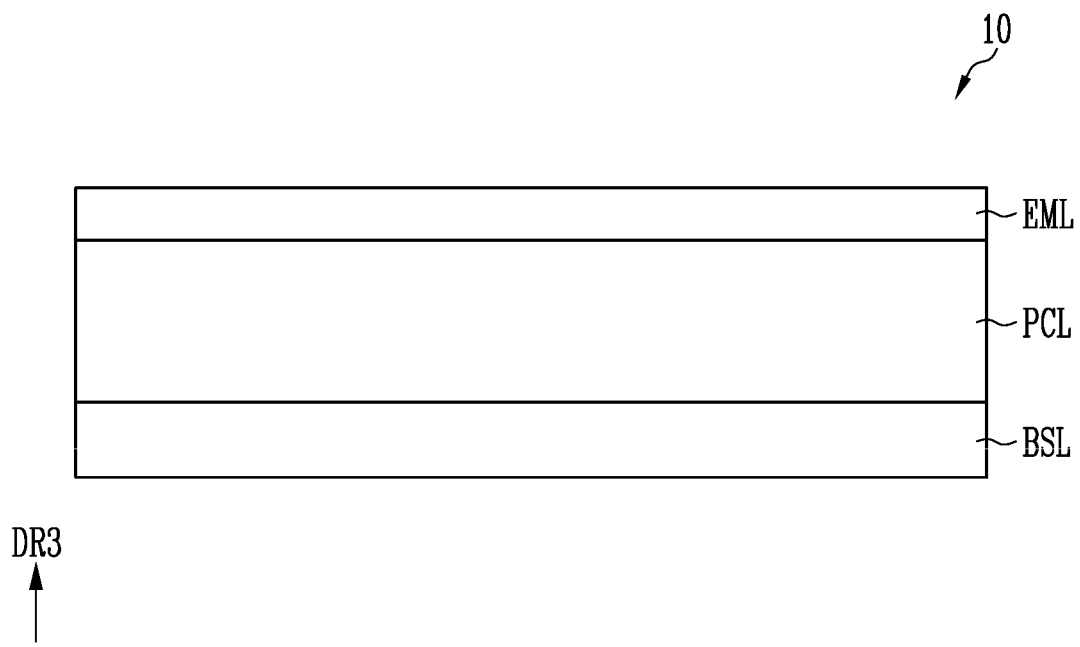
FIG. 6 is a schematic cross-sectional view illustrating a display device in accordance with some embodiments of the present disclosure.

FIG. 6 is a schematic cross-sectional view illustrating a section of a display device in accordance with some embodiments of the present disclosure.

Referring to FIG. 6, the display device 10 may include a base layer BSL, a pixel circuit layer PCL, and a light emitting layer EML.

The base layer BSL may be a base substrate or a base member, which is used to support the display device 10. The base layer BSL may be a rigid substrate made of glass. Also, the base layer BSL may be a flexible substrate which is bendable, foldable, rollable, and/or the like. The substrate may include an insulating material including polymer resin such as polyimide. However, embodiments of the present disclosure are not necessarily limited thereto.

In some embodiments, a buffer layer capable of preventing or substantially reducing occurrence of a phenomenon in which metal atoms or impurities are diffused from the base layer BSL may be disposed on the base layer BSL. However, herein, embodiments in which the buffer layer is not disposed have been illustrated.

The pixel circuit layer PCL may be disposed on the base layer BSL. The pixel circuit layer PCL may include at least one circuit element constituting the pixel circuit shown in FIG. 4.

The pixel circuit layer PCL may include a plurality of transistors T1 to T5, a plurality of capacitors C1 and C2, a data line DL, a first power line VDDL, a scan line SL, and a second power line VSSL, which are used in the pixel circuit PXC. The pixel circuit layer PCL discloses an arrangement/stacked structure of the plurality of transistors T1 to T5, the plurality of capacitors C1 and C2, the data line DL, the first power line VDDL, the scan line SL, and the second power line VSSL, which are used in the pixel circuit PXC in a narrow area. An arrangement/stacked relation of the pixel circuit layer PCL in accordance with some embodiments of the present disclosure will be described later in conjunction with FIGS. 7 to 9.

The light emitting layer EML may be disposed on the pixel circuit layer PCL. The light emitting layer EML may include a first electrode, a second electrode, and a light emitting part. The first electrode of the light emitting layer EML may be an anode electrode, and the second electrode of the light emitting layer EML may be a cathode electrode. In some embodiments, the anode electrode of the light emitting layer EML is electrically connected to the pixel circuit PXC formed in the pixel circuit layer PCL. The cathode electrode of the light emitting layer EML may be electrically connected to the second power line VSSL formed in the pixel circuit layer PCL.

Figure 7:
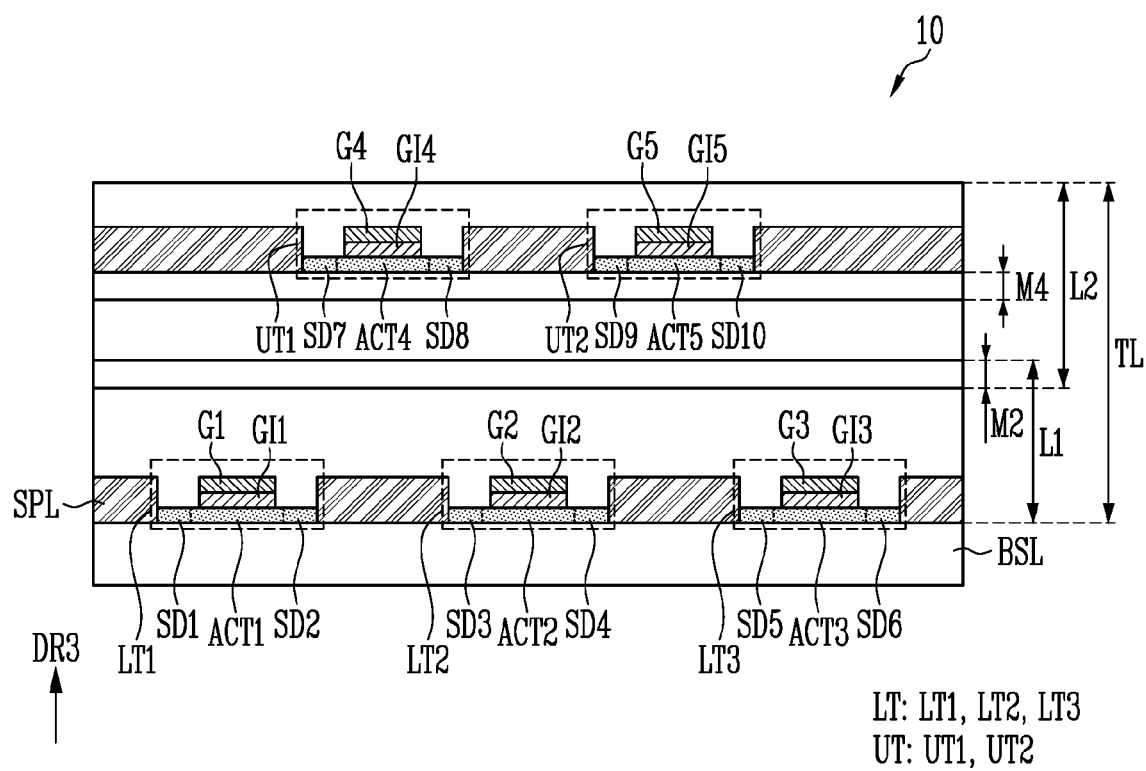
FIGS. 7 to 9 are schematic cross-sectional views illustrating a pixel circuit layer of a display device in accordance with some embodiments of the present disclosure.
Figure 8:
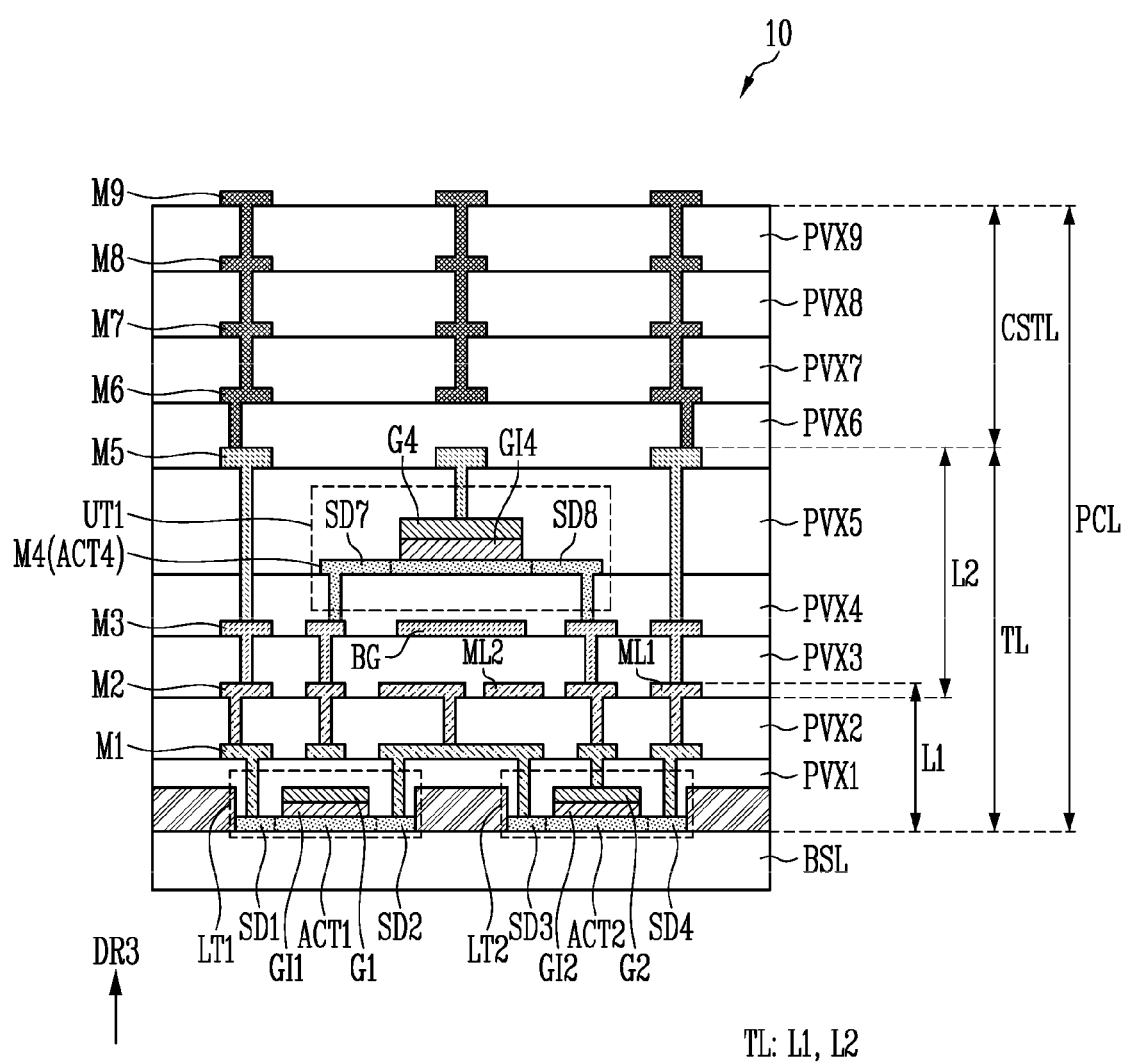
Figure 9:
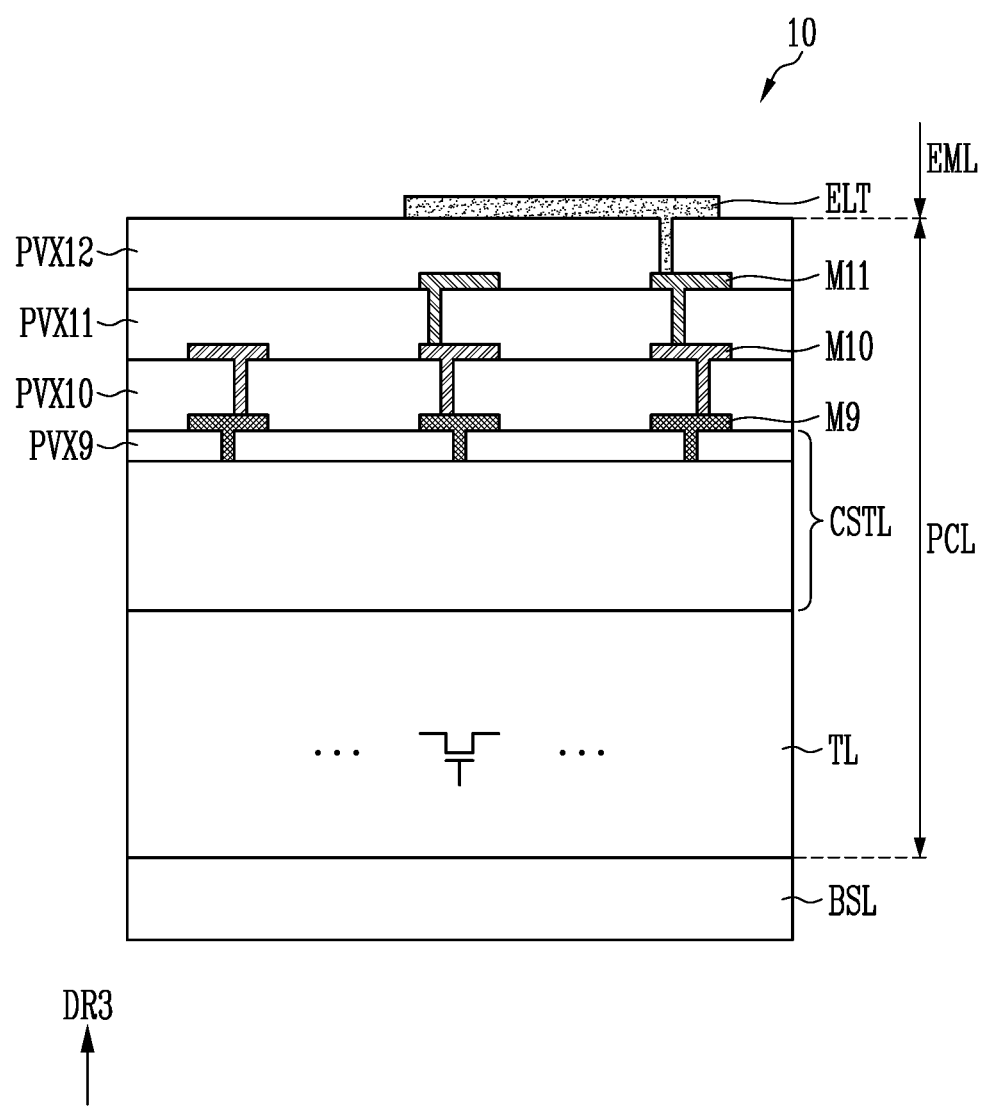

FIGS. 7 to 9 are schematic cross-sectional views illustrating a pixel circuit layer of a display device in accordance with some embodiments of the present disclosure. FIGS. 7 to 9 may be views illustrating in more detail the pixel circuit layer PCL of the display device 10 in accordance with some embodiments of the present disclosure. FIG. 7 may be a view illustrating an arrangement relationship of an upper transistors UT and a lower transistors LT in the pixel circuit layer PCL. In FIG. 7, illustration of some components (e.g., lines forming a pixel circuit PXC) of the display device 10 is omitted such that the arrangement relationship of the upper transistors UT and the lower transistors LT is clearly illustrated. FIG. 8 may illustrate a connection relationship sectional structure of some of transistors T1 to T5 shown in FIG. 7 and some of the lines forming the pixel circuit PXC. FIG. 9 may illustrate a sectional structure in which the pixel circuit layer PCL and a light emitting layer EML are connected to each other. Hereinafter, the pixel circuit layer PCL in accordance with some embodiments of the present disclosure will be described in more detail with reference to FIGS. 7 to 9.

The pixel circuit layer PCL may include a transistor layer TL in which transistors T1 to T5 are disposed and a capacitor layer CSTL in which capacitors C1 and C2 are disposed. In some embodiments, the transistors T1 to T5 and the capacitors C1 and C2 are respectively disposed at different layers along a vertical direction (e.g., the third direction DR3).

The transistor layer TL may be disposed on a base layer BSL. The transistor layer TL may be disposed between the base layer BSL and the capacitor layer CSTL.

The transistor layer TL may include a first layer L1 and a second layer L2. The first layer L1 may include a lower transistor LT. The second layer L2 may include an upper transistors UT. The first layer L1 and the second layer L2 may share a second conductive layer M2. The second conductive layer M2 may be an intermediate conductive layer disposed between the upper transistors UT and the lower transistor LT.

In some embodiments, the upper transistors UT and the lower transistors LT are stacked in a vertical direction. The upper transistors UT may be disposed on the lower transistors LT. The lower transistors LT may be disposed under the upper transistors UT in a gravity direction (e.g., plan view direction or the third direction DR3). In the display device 10, the upper transistors UT (e.g., a second transistor T2 and a third transistor T3) including an oxide semiconductor may be on the lower transistors (e.g., a first transistor T1, a fourth transistor T4, and a fifth transistor T5) including a silicon semiconductor so as to allow components to be integrated in an area as narrow as possible.

In some embodiments, the upper transistors UT and the lower transistors LT include different semiconductor materials. The upper transistors UT (e.g., the second transistor T2 and the third transistor T3) may include an oxide semiconductor. In some embodiments, the oxide semiconductor include at least one selected from the group consisting of indium oxide ($In_xO_y$), indium gallium zinc oxide (IGZO), zinc oxide ($Zn_xO_y$), zinc tin oxide (ZTO: $Zn_xSn_yO_z$), and indium zinc oxide ($In_xZn_yO_z$).

The lower transistors LT (e.g., the first transistor T1, the fourth transistor T4, and the fifth transistor T5) may include a silicon semiconductor. In some embodiments, the silicon semiconductor includes at least one selected from the group consisting of poly-silicon, Low Temperature Polycrystalline Silicon (LTPS), and amorphous silicon.

Hereinafter, the structure of the display device 10 in relation to the upper transistors UT and the lower transistors LT will be described in more detail.

The lower transistors LT may include a first lower transistor LT1, a second lower transistor LT2, and a third lower transistor LT3. In some embodiments, the first lower transistor LT1, the second lower transistor LT2, and the third lower transistor LT3 are disposed at the same layer. However, embodiments of the present disclosure are not limited thereto, and the first lower transistor LT1, the second lower transistor LT2, and the third lower transistor LT3 may be disposed at different layers. For example, the first lower transistor LT1 may be disposed on the second lower transistor LT2.

The upper transistors UT may include a first upper transistor UT1 and a second upper transistor UT2. In some embodiments, the first upper transistor UT1 and the second upper transistor UT2 are disposed at the same layer. However, embodiments of the present disclosure are not limited thereto. The first upper transistor UT1 may be disposed on the second upper transistor UT2, and the second upper transistor UT2 may be disposed on the first upper transistor UT1.

For convenience of description, only the first lower transistor LT1, the second lower transistor LT2, and the first upper transistor UT1 are illustrated in FIG. 8. Hereinafter, an arrangement relationship between the upper and lower transistors UT and LT and other components in the pixel circuit PXC will be described with reference to the sectional structure shown in FIG. 8.

Hereinafter, technical features described with reference to the first lower transistor LT1 and the second lower transistor LT2 may be applied to the third lower transistor LT3, and technical features described with reference to the first upper transistor UT1 may be applied to the second upper transistor UT2.

The first lower transistor LT1 may include a first active layer ACT1 and a first gate electrode G1. The first lower transistor LT1 may be disposed on the base layer BSL. In some embodiments, the first lower transistor LT1 is the fourth transistor T4.

The first active layer ACT1 may include a first interlayer conductive layer SD1 and a second interlayer conductive layer SD2. The first interlayer conductive layer SD1 and the second interlayer conductive layer SD2 may be a source electrode and a drain electrode, respectively, of the first lower transistor LT1. However, embodiments of the present disclosure are not limited thereto. For example, the first interlayer conductive layer SD1 and the second interlayer conductive layer SD2 may be the drain electrode and the source electrode, respectively, of the first lower transistor LT1. The first interlayer conductive layer SD1 and the second interlayer conductive layer SD2 may be part of the first transistor electrode or the second transistor electrode of the lower transistors LT shown in FIG. 4. The first active layer ACT1 may include a silicon semiconductor and/or the like.

The first gate electrode G1 may be a gate electrode of the first lower transistor LT1. The first gate electrode G1 may be a gate electrode of the fourth transistor T4. However, embodiments of the present disclosure are not limited thereto.

The first gate electrode G1 may not be electrically connected to the second conductive layer M2. However, embodiments of the present disclosure are not limited thereto. For example, the intermediate conductive layer may not be electrically connected to a gate electrode of at least one transistor among the plurality of transistors T1 to T5.

The second lower transistor LT2 may include a second active layer ACT2 and a second gate electrode G2. The second lower transistor LT2 may be disposed on the base layer BSL. In some embodiments, the second lower transistor LT2 is the first transistor T1.

The second active layer ACT2 may include a third interlayer conductive layer SD3 and a fourth interlayer conductive layer SD4. The third interlayer conductive layer SD3 and the fourth interlayer conductive layer SD4 may be a source electrode and a drain electrode, respectively, of the second lower transistor LT2. However, embodiments of the present disclosure are not limited thereto. For example, the third interlayer conductive layer SD3 and the fourth interlayer conductive layer SD4 may be the drain electrode and the source electrode, respectively, of the second lower transistor LT2. The third interlayer conductive layer SD3 and the fourth interlayer conductive layer SD4 may be part of the first transistor or the second transistor of the lower transistors LT shown in FIG. 4. The second active layer ACT2 may include a silicon semiconductor and/or the like.

The second gate electrode G2 may be a gate electrode of the second lower transistor LT2. The second gate electrode G2 may be a gate electrode of the first transistor T1. However, embodiments of the present disclosure are not limited thereto.

The first lower transistor LT1 and the second lower transistor LT2 may be electrically connected to each other. The second interlayer conductive layer SD2 of the first lower transistor LT1 may be electrically connected to the third interlayer conductive layer SD3 of the second lower transistor LT2. For example, when the first lower transistor LT1 and the second lower transistor LT2 are respectively the fourth transistor T4 and the first transistor T1, the second interlayer conductive layer SD2 of the first lower transistor LT1 may be a first transistor electrode of the fourth transistor T4, and the third interlayer conductive layer SD3 of the second lower transistor LT2 may be a second transistor electrode of the first transistor T1.

The third lower transistor LT3 may include a third active layer ACT3 and a third gate electrode G3. The third lower transistor LT3 may be disposed on the base layer BSL. In some embodiments, the third lower transistor LT3 is the fifth transistor T5.

The third active layer ACT3 may include a fifth interlayer conductive layer SD5 and a sixth interlayer conductive layer SD6. The fifth interlayer conductive layer SD5 and the sixth interlayer conductive layer SD6 may be a source electrode and a drain electrode, respectively, of the third lower transistor LT3. However, embodiments of the present disclosure are not limited thereto. For example, the fifth interlayer conductive layer SD5 and the sixth interlayer conductive layer SD6 may be the drain electrode and the source electrode, respectively, of the third lower transistor LT3. The fifth interlayer conductive layer SD5 and the sixth interlayer conductive layer SD6 may be part of the first transistor electrode or the second transistor electrode of the lower transistors LT shown in FIG. 4. The third active layer ACT3 may include a silicon semiconductor and/or the like.

The third gate electrode G3 may be a gate electrode of the third lower transistor LT3. The third gate electrode G3 may be a gate electrode of the fifth transistor T5. However, embodiments of the present disclosure are not limited thereto.

A second transistor electrode of the third lower transistor LT3 may be electrically connected to the first interlayer conductive layer SD1 of the first lower transistor LT1.

A first gate insulating layer GI1 may be disposed between the first active layer ACT1 and the first gate electrode G1. A second gate insulating layer GI2 may be disposed between the second active layer ACT2 and the second gate electrode G2. A third gate insulating layer GI3 may be disposed between the third active layer ACT3 and the third gate electrode G3.

An isolation layer SPL may be disposed between the first, second, and third lower transistors LT1, LT2, and LT3. The isolation layer SPL may electrically insulate the first lower transistor LT1 and the second lower transistor LT2 from each other by distinguishing the first lower transistor LT1 and the second lower transistor LT2 from each other so as to prevent the first lower transistor LT1 and the second lower transistor LT2 from being in contact with each other. For example, the isolation layer SPL may be disposed between the first upper transistor UT1 and the second upper transistor UT2.

The first upper transistor UT1 may include a fourth active layer ACT4 and a fourth gate electrode G4. The first upper transistor UT1 may be disposed on the base layer BSL. In some embodiments, the first upper transistor UT1 is the third transistor T3.

In some embodiments, the first upper transistor UT1 further includes a back gate electrode BG. The back gate electrode BG may be supplied with the same gate signal as the fourth gate electrode G4, and serve as a gate electrode for the fourth active layer ACT4.

The fourth active layer ACT4 may include a seventh interlayer conductive layer SD7 and an eighth interlayer conductive layer SD8. The seventh interlayer conductive layer SD7 and the eighth interlayer conductive layer SD8 may be a source electrode and a drain electrode, respectively, of the upper transistor UT. However, embodiments of the present disclosure are not limited thereto. For example, the seventh interlayer conductive layer SD7 and the eighth interlayer conductive layer SD8 may be the drain electrode and the source electrode, respectively, of the upper transistor UT. The seventh interlayer conductive layer SD7 and the eighth interlayer conductive layer SD8 may be the first transistor electrode or the second transistor electrode of the upper transistors UT shown in FIG. 4. The fourth active layer ACT4 may include an oxide semiconductor and/or the like.

The fourth gate electrode G4 may be a gate electrode of the first upper transistor UT1. The fourth gate electrode G4 may be a gate electrode of the third transistor T3. However, embodiments of the present disclosure are not limited thereto.

The second upper transistor UT2 may include a fifth active layer ACT5 and a fifth gate electrode G5. The second upper transistor UT2 may be disposed on the base layer BSL. In some embodiments, the second upper transistor UT2 is the second transistor T2.

In some embodiments, the second upper transistor UT2 further includes a back gate electrode. The back gate electrode may be supplied with the same gate signal as the fifth gate electrode G5, and serve as a gate electrode for the fifth active layer ACT5.

The fifth active layer ACT5 may include a ninth interlayer conductive layer SD9 and a tenth interlayer conductive layer SD10. The ninth interlayer conductive layer SD9 and the tenth interlayer conductive layer SD10 may be the drain electrode and the source electrode of the upper transistor UT. However, embodiments of the present disclosure are not limited thereto. The ninth interlayer conductive layer SD9 and the tenth interlayer conductive layer SD10 may be the drain electrode and the source electrode of the upper transistor UT. The ninth interlayer conductive layer SD9 and the tenth interlayer conductive layer SD10 may be the first transistor electrode or the second transistor electrode of the upper transistors UT shown in FIG. 4. The fifth active layer ACT5 may include an oxide semiconductor.

The fifth gate electrode G5 may be a gate electrode of the second upper transistor UT2. The fifth gate electrode G5 may be a gate electrode of the second transistor T2. However, embodiments of the present disclosure are not limited thereto.

A fourth gate insulating layer GI4 may be disposed between the fourth active layer ACT4 and the fourth gate electrode G4. A fifth gate insulating layer GI5 may be disposed between the fifth active layer ACT5 and the fifth gate electrode G5.

The transistor layer TL may further include first to fifth conductive layers M1 to M5 for electrically connecting the upper transistors UT and the lower transistors LT to each other and first to fifth protective layer PVX1 to PVX5 for insulating conductive layers including the first to fifth conductive layers M1 to M5 from each other.

The first protective layer PVX1 may be disposed over the lower transistor LT. The first protective layer PVX1 may be in contact with at least a portion of the lower transistor LT. The first protective layer PVX1 may entirely cover (e.g., in a plan view) the lower transistor LT, to planarize an upper portion of the lower transistor LT. The first protective layer PVX1 may include a contact hole for electrically connecting the lower transistors LT and the first conductive layer M1 to each other.

The first conductive layer M1 may be disposed on the first protective layer PVX1, and be electrically connected to the lower transistors LT through the contact hole formed in the first protective layer PVX1.

The first conductive layer M1 may be electrically connected to the first interlayer conductive layer SD1 and the second interlayer conductive layer SD2 of the first lower transistor LT1. The first conductive layer M1 may be electrically connected to the third interlayer conductive layer SD3 and the fourth interlayer conductive layer SD4 of the second lower transistor LT2. The first conductive layer M1 may be electrically connected to the second gate electrode G2 of the second lower transistor LT2.

At least a portion of the first conductive layer M1 may be a scan line SL of the lower transistor LT. For example, although a connection relationship of the third lower transistor LT3 and the first conductive layer M1 is not shown in these drawings, at least a portion of the first conductive layer M1 connected to the third lower transistor LT3 may be a third scan signal line GBL electrically connected to the third gate electrode G3 of the fifth transistor T5. However, embodiments of the present disclosure are not limited thereto.

The second protective layer PVX2 may be disposed over the first conductive layer M1. The second protective layer PVX2 may be at least partially in contact with the first protective layer PVX1, and be disposed on the first protective layer PVX1. The second protective layer PVX2 may entirely cover (e.g., in a plan view) the first conductive layer M1, to planarize an upper portion of the first conductive layer M1. The second protective layer PVX2 may include a contact hole for electrically connecting the second conductive layer M2 and the first conductive layer M1 to each other.

The second conductive layer M2 may be electrically connected to the first conductive layer M1 through the contact hole formed in the second protective layer PVX2.

The second conductive layer M2 may include a first conductive line layer ML1 and a second conductive line layer ML2. The first conductive line layer ML1 may be a first power line VDDL, and the second conductive line ML2 may be a data line DL. The first conductive line layer ML1 and the second conductive line layer ML2 may be disposed at the same layer.

The first conductive line layer ML1 may be electrically connected to the fourth interlayer conductive layer SD4 of the second lower transistor LT2, and be electrically connected to a sixth conductive layer M6 of the capacitor layer CSTL.

The first conductive line layer ML1 may apply (e.g., conduct) a voltage corresponding to a first power source ELVDD to the fourth interlayer conductive layer SD4 of the second lower transistor LT2. The fourth interlayer conductive layer SD4 may be a source electrode of the first transistor T1, and the third interlayer conductive layer SD3 may be a drain electrode of the first transistor T1.

The data line DL and a first transistor electrode of the second upper transistor UT2 may be electrically connected to each other, and the second conductive line layer ML2 may apply (e.g., conduct) a voltage corresponding to a data voltage to the first transistor electrode of the second upper transistor UT2 through the data line DL.

The first conductive line layer ML1 and the second conductive line layer ML2 may be formed at the same layer. As the second conductive layer M2 including the data line and the first power line VDDL is formed between the upper transistors UT and the lower transistor LT, the upper transistors UT and the lower transistors LT may share the second conductive layer M2. The second conductive layer M2 may be electrically connected to a first transistor electrode of each of the upper transistors UT and the lower transistors LT.

In the related art, in a monolithic structure in which the upper transistors UT including an oxide semiconductor is stacked on the lower transistors LT including a silicon semiconductor, the data line DL and the first power line VDDL, which are to be electrically connected to the lower transistor LT, are formed, and the data line DL and the first power line VDDL, which are to be electrically connected to the upper transistor UT, may be separately formed on the upper transistor UT. Hence, a conductive structure corresponding to the second conductive layer M2 may be formed while being divided in two layers.

That is, in the related art, an upper transistors UT integrated layer and a lower transistors LT integrated layer may be separated from each other in a process so as to be stacked in the monolithic structure. Hence, the data line DL and the first power line VDDL may be formed on each of the transistors LT and UT. Therefore, a process for forming lines may be further required. Accordingly, the fabrication process may be complicated, and the number of process steps may be increased.

In the display device 10 in accordance with some embodiments of the present disclosure, the second conductive layer M2 including the first power line VDDL is formed at the same layer between the upper transistors UT and the lower transistor LT. The second conductive layer M2 is connected to the source electrode or the drain electrode of each of the upper transistors UT and the lower transistor LT. Accordingly, as the upper transistors UT and the lower transistors LT are electrically connected to the data line DL and the first power line VDDL, which are formed at the same layer, when the transistors T1 to T5 are turned on, the upper transistors UT and the lower transistors LT can share the data line DL and the first power line VDDL. Thus, it is unnecessary for the data line DL and the first power line VDDL to be separately formed on the upper transistor UT, so that a process for forming the data line DL and the first power line VDDL on the upper transistors UT can be omitted. Accordingly, the fabrication process can be simplified, and process cost can be reduced.

The third protective layer PVX3 may be disposed on the second conductive layer M2. The third protective layer PVX3 may be at least partially in contact with the second protective layer PVX2, and be disposed on the second protective layer PVX2. The third protective layer PVX3 may entirely cover (e.g., in a plan view) the second conductive layer M2, to planarize an upper portion of the second conductive layer M2. The third protective layer PVX3 may include a contact hole for electrically connecting the third conductive layer M3 and the second conductive layer M2 to each other.

The third conductive layer M3 may be disposed on the third protective layer PVX3. The third conductive layer M3 may be electrically connected to the second conductive layer M2 through the contact hole of the third protective layer PVX3. The third conductive layer M3 may include a back gate electrode BG. In some examples, the back gate electrode BG may be omitted, and hence the third conductive layer M3 may not include the back gate electrode BG.

The fourth protective layer PVX4 may be disposed over the third conductive layer M3. The fourth protective layer PVX4 may be at least partially in contact with the third protective layer PVX3, and be disposed on the third protective layer PVX3. The fourth protective layer PVX4 may entirely cover (e.g., in a plan view) the third conductive layer M3, to planarize an upper portion of the third conductive layer M3. The fourth protective layer PVX4 may include a contact hole for electrically connecting the third conductive layer M3 and the fourth conductive layer M4 to each other.

The fourth conductive layer M4 may be disposed on the fourth protective layer PVX4. The fourth conductive layer M4 may be electrically connected to the third conductive layer M3 through the contact hole of the fourth protective layer PVX4. The fourth conductive layer M4 may include the fourth active layer ACT4.

The fourth active layer ACT4 may include the seventh interlayer conductive layer SD7 and the eighth interlayer conductive layer SD8.

The fifth protective layer PVX5 may be disposed over the fourth conductive layer M4. The fifth protective layer PVX5 may be at least partially in contact with the fourth protective layer PVX4, and be provided on the fourth protective layer PVX4. The fifth protective layer PVX5 may entirely cover (e.g., in a plan view) the upper transistor UT, to planarize an upper portion of the upper transistor UT. The fifth protective layer PVX5 may include a contact hole for electrically connecting the third conductive layer M3 and the fifth conductive layer M5 to each other. The fifth protective layer PVX5 may include a contact hole for electrically connecting the fourth gate electrode G4 and the fifth conductive layer M5 to each other.

The fifth conductive layer M5 may be disposed on the fifth protective layer PVX5. The fifth conductive layer M5 may be electrically connected to the third conductive layer M3 through the contact hole of the fifth protective layer PVX5. The fifth conductive layer M5 may be electrically connected to the fourth gate electrode G4 through the contact hole of the fifth protective layer PVX5.

At least a portion of the fifth conductive layer M5 may be electrically connected to the first interlayer conductive layer SD1 of the first lower transistor LT1 and the fourth interlayer conductive layer SD4 of the second lower transistor LT2. The other portion of the fifth conductive layer M5 may be electrically connected to the fourth gate electrode G4 of the first upper transistor UT1.

The fifth conductive layer M5 electrically connected to the fourth gate electrode G4 of the first upper transistor UT1 may be a portion of a scan line SL of the first upper transistor UT1. When the first upper transistor UT1 is the third transistor T3, the fifth conductive layer M5 connected to the fourth gate electrode G4 of the first upper transistor UT1 may be a second scan signal line GCL electrically connected to the fourth gate electrode G4 the third transistor T3.

The fifth conductive layer M5 may be electrically connected to the fifth gate electrode G5 of the second upper transistor UT2. The fifth conductive layer M5 electrically connected to the fifth gate electrode G5 of the second upper transistor UT2 may be a first scan signal line GWL electrically connected to the fifth gate electrode G5 of the second transistor T2.

In some embodiments, the first scan signal line GWL and the second scan signal line GCL are disposed at the same layer. The first scan signal line GWL and the second scan signal line GCL may be disposed on the third scan signal line GBL. The first scan signal line GWL and the second scan signal line GCL may be formed in the same process, and be formed in a process different from a process of forming the third scan signal line GBL.

The capacitor layer CSTL may be disposed over the fifth conductive layer M5. The capacitor layer CSTL may not include the upper transistors UT and the lower transistor LT. The capacitor layer CSTL may include sixth to ninth conductive layers M6 to M9 and sixth to ninth protective layers PVX6 to PVX9. Herein, it is illustrated that the capacitor layer CSTL includes four conductive layers M6 to M9 and four protective layers PVX6 to PVX9. However, in some examples, the numbers of conductive layers and protective layers, which are used to form the capacitor layer CSTL, may be changed. For example, the number of conductive layers may be smaller than 4, and be equal to or greater than 4. The number of protective layers may be smaller than 4, and be equal to or greater than 4.

The sixth protective layer PVX6, the sixth conductive layer M6, the seventh protective layer PVX7, the seventh conductive layer M7, the eighth protective layer PVX8, the eighth conductive layer M8, the ninth protective layer PVX9, and the ninth conductive layer M9 may be sequentially disposed over the fifth conductive layer M5 in a thickness direction of the base layer BSL.

The sixth to ninth conductive layers M6 to M9 may include electrodes for forming a first capacitor C1 and a second capacitor C2. The sixth to ninth conductive layer M6 to M9 may be layers for forming capacitors of the upper transistors UT and the lower transistor LT. The sixth conductive layer M6 may be a first capacitor conductive layer. The seventh conductive layer M7 may be a second capacitor conductive layer. The eighth conductive layer M8 may be a third capacitor conductive layer. The ninth conductive layer M9 may be a fourth capacitor conductive layer.

The sixth protective layer PVX6 may be disposed over the fifth conductive layer M5. The sixth protective layer PVX6 may include a contact hole capable of electrically connecting the sixth conductive layer M6 and the fifth conductive layer M5 to each other. The sixth protective layer PVX6 may entirely cover (e.g., in a plan view) the fifth conductive layer M5. The sixth protective layer PVX6 may be in contact with at least a portion of the fifth protective layer PVX5.

The sixth conductive layer M6 may be electrically connected to the fifth conductive layer M5 through the contact hole formed in the sixth protective layer PVX6. The sixth conductive layer M6 may include at least one of a first capacitor electrode or a second capacitor electrode of the first capacitor C1 or the second capacitor C2.

The seventh protective layer PVX7 may be disposed over the sixth conductive layer M6. The seventh protective layer PVX7 may include a contact hole capable of electrically connecting the seventh conductive layer M7 and the sixth conductive layer M6 to each other. The seventh protective layer PVX7 may entirely cover (e.g., in a plan view) the sixth conductive layer M6. The seventh protective layer PVX7 may be in contact with at least a portion of the sixth protective layer PVX6.

The seventh conductive layer M7 may be electrically connected to the sixth conductive layer M6 through the contact hole formed in the seventh protective layer PVX7. The seventh conductive layer M7 may include at least one of the first capacitor electrode or the second capacitor electrode of the first capacitor C1 or the second capacitor C2.

The eighth protective layer PVX8 may be disposed over the seventh conductive layer M7. The eighth protective layer PVX8 may include a contact hole capable of electrically connecting the eighth conductive layer M8 and the seventh conductive layer M7 to each other. The eighth protective layer PVX8 may entirely cover (e.g., in a plan view) the seventh conductive layer M7. The eighth protective layer PVX8 may be in contact with at least a portion of the seventh protective layer PVX7.

The eighth conductive layer M8 may be electrically connected to the seventh conductive layer M7 through the contact hole formed in the eighth protective layer PVX8. The eighth conductive layer M8 may include at least one of the first capacitor electrode or the second capacitor electrode of the first capacitor C1 or the second capacitor C2.

The ninth protective layer PVX9 may be disposed over the eighth conductive layer M8. The ninth protective layer PVX9 may include a contact hole capable of electrically connecting the ninth conductive layer M9 and the eighth conductive layer M8 to each other. The ninth protective layer PVX9 may entirely cover (e.g., in a plan view) the eighth conductive layer M8. The ninth protective layer PVX9 may be in contact with at least a portion of the eighth protective layer PVX8.

The ninth conductive layer M9 may be electrically connected to the eight conductive layer M8 through the contact hole formed in the ninth protective layer PVX9. The ninth conductive layer M9 may include at least one of the first capacitor electrode or the second capacitor electrode of the first capacitor C1 or the second capacitor C2.

In the related art, as an integrated layer of the upper transistors UT and an integrated layer of the lower transistors LT are separated from each other, the data line DL and the first power line VDDL may be respectively disposed at two layers, and a layer for capacitor formation of the lower transistors LT and a layer for capacitor formation of the upper transistors UT may be separately manufactured. Accordingly, in the related art, one capacitor layer CSTL may be disposed between the upper transistors UT and the lower transistor LT, and another capacitor layer may be disposed on the upper transistor UT. Therefore, a process for forming the capacitor layer CSTL was additionally performed. Accordingly, the yield of the display device may be decreased due to an increase in process number, and manufacturing cost may be increased.

In addition, according to a capacitor structure of the related art, as one capacitor layer may be disposed between the upper transistors UT and the lower transistor LT, a contact hole may be required in a process of connecting the capacitor layer and the transistor LT or UT. As the contact hole for connecting the capacitor layer is formed, it may be difficult for a portion of the capacitor layer to serve as a layer for capacitor formation.

In the display device 10 in accordance with some embodiments of the present disclosure, one capacitor layer CSTL is disposed on the upper transistors UT and the lower transistor LT, so that the number of layers disposed on the base layer BSL can be decreased. In the display device 10 in accordance with some embodiments of the present disclosure, the upper transistors UT and the lower transistors LT share the capacitor layer CSTL for capacitor formation, so that the need for positioning the capacitor layer CSTL between the upper transistors UT and the lower transistors LT can be reduced or eliminated.

In addition, as only one capacitor layer CSTL is disposed, a portion of the capacitor layer is not excluded as a layer for connection with another component, but the capacitor layer can be perfectly used as a layer for capacitor formation.

A tenth protective layer PVX10, a tenth conductive layer M10, an eleventh protective layer PVX11, an eleventh conductive layer M11, and a twelfth protective layer PVX12 may be sequentially disposed on the capacitor layer CSTL in the thickness direction of the base layer BSL.

The tenth protective layer PVX10 may be disposed over the ninth conductive layer M9. The tenth protective layer PVX10 may include a contact hole capable of electrically connecting the ninth conductive layer M9 and the tenth conductive layer M10 to each other. The tenth protective layer PVX10 may entirely cover (e.g., in a plan view) the ninth conductive layer M9. The tenth protective layer PVX10 may be in contact with at least a portion of the ninth protective layer PVX9.

The tenth conductive layer M10 may be electrically connected to the ninth conductive layer M9 through the contact hole of the tenth protective layer PVX10. At least a portion of the tenth conductive layer M10 may be a line for supplying the first power source ELVDD to the second capacitor C2 shown in FIG. 4.

The eleventh protective layer PVX11 may be disposed over the tenth conductive layer M10. The eleventh protective layer PVX11 may include a contact hole for electrically connecting the tenth conductive layer M10 and the eleventh conductive layer M11 to each other. The eleventh protective layer PVX11 may entirely cover (e.g., in a plan view) the tenth conductive layer M10. The eleventh protective layer PVX11 may be in contact with at least a portion of the tenth protective layer PVX10.

The eleventh conductive layer M11 may be electrically connected to the tenth conductive layer M10 through the contact hole of the eleventh protective layer PVX11. At least a portion of the eleventh conductive layer M11 may be a second power line VSSL to be electrically connected to the cathode electrode of the light emitting element LD shown in FIG. 4. For example, the eleventh conductive layer M11 which is not connected to an electrode ELT may be the second power line VSSL to be electrically connected to the cathode electrode of the light emitting element LD.

The twelfth protective layer PVX12 may be disposed over the eleventh conductive layer M11. The twelfth protective layer PVX12 may include a contact hole capable of electrically connecting the eleventh conductive layer M11 and the electrode ELT of a light emitting layer EML to each other. The electrode ELT of the light emitting layer EML may be the anode electrode of the light emitting element LD. The twelfth protective layer PVX12 may entirely cover (e.g., in a plan view) the eleventh conductive layer M11. The twelfth protective layer PVX12 may be in contact with at least a portion of the eleventh protective layer PVX11.

In some embodiments, the first to twelfth protective layers PVX1 to PVX12 include an organic material. The organic material may include at least one selected from the group consisting of acrylic resin, epoxy resin, phenolic resin, polyamide resin, polyimide resin, polyester resin, polyphenylene sulfide resin, and benzocyclobutene. However, embodiments of the present disclosure are not limited thereto.

In some embodiments, the first to twelfth protective layers PVX1 to PVX12 include an inorganic material. The inorganic material may include at least one selected from the group consisting of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), and silicon oxynitride ($SiO_xN_y$). However, embodiments of the present disclosure are not limited thereto.

In some embodiments, the first to eleventh conductive layers M1 to M11 include a conductive material. The conductive material may include at least one of aluminum (Al), tungsten (W), titanium (Ti), or copper (Cu). However, embodiments of the present disclosure are not limited thereto.

In accordance with some embodiments of the present disclosure, there can be provided a display device in which components of the display device can be intensively formed in one area, and a manufacturing process of the display device can be simplified.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The display device and/or any other relevant devices or components, such as the timing controller, according to embodiments of the present invention described herein may be implemented utilizing any suitable hardware, firmware (e.g., an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the spirit and scope of the disclosure as defined by the following claims and equivalents thereof.

What is claimed is:

1. A display device comprising:
    a base layer;
    a pixel circuit layer on the base layer, the pixel circuit layer comprising a pixel circuit; and
    a light emitting layer on the pixel circuit layer, the light emitting layer comprising a light emitting element electrically connected to the pixel circuit,
    wherein the pixel circuit layer comprises:
        a lower transistor on the base layer, the lower transistor comprising a silicon semiconductor;
        an upper transistor on the lower transistor, the upper transistor comprising an oxide semiconductor; and
        an intermediate conductive layer between the lower transistor and the upper transistor, and
    wherein the intermediate conductive layer comprises a data line and a first power line, each of which is electrically connected to the pixel circuit.

2. The display device of claim 1, wherein the data line and the first power line are at a same layer.

3. The display device of claim 2, wherein the data line and the first power line comprise a same material.

4. The display device of claim 2, wherein the intermediate conductive layer electrically connects a first transistor electrode of the upper transistor and a first transistor electrode of the lower transistor to each other.

5. The display device of claim 4, wherein the upper transistor comprises a plurality of transistors, and
    wherein at least a portion of the intermediate conductive layer is not electrically connected to a gate electrode of at least one transistor among the plurality of transistors.

6. The display device of claim 2, wherein the pixel circuit comprises a first transistor, a second transistor, a third transistor, a fourth transistor, and a fifth transistor,
    wherein the lower transistor comprises the first transistor, the fourth transistor, and the fifth transistor, and
    wherein the upper transistor comprises the second transistor and the third transistor.

7. The display device of claim 6, wherein the first power line is electrically connected to a first transistor electrode of the first transistor, and
    wherein the data line is electrically connected to a first transistor electrode of the second transistor.

8. The display device of claim 6, wherein the pixel circuit layer comprises:
    a first scan signal line electrically connected to a gate electrode of the second transistor;
    a second scan signal line electrically connected to a gate electrode of the third transistor; and
    a third scan signal line electrically connected to a gate electrode of the fifth transistor.

9. The display device of claim 8, wherein the first scan signal line and the second scan signal line are on the third scan signal line.

10. The display device of claim 9, wherein the first scan signal line and the second scan signal line are at a same layer.

11. The display device of claim 10, wherein the intermediate conductive layer is on the third scan signal line, and
    wherein the first scan signal line and the second scan signal line are on the intermediate conductive layer.

12. The display device of claim 1, wherein the pixel circuit layer further comprises a capacitor layer in which at least one capacitor is positioned, and
    wherein the capacitor layer does not comprise the upper transistor and the lower transistor.

13. The display device of claim 12, wherein the capacitor layer comprises:
    a first capacitor conductive layer;
    a second capacitor conductive layer on the first capacitor conductive layer;
    a third capacitor conductive layer on the second capacitor conductive layer; and
    a fourth capacitor conductive layer on the third capacitor conductive layer.

14. The display device of claim 12, further comprising a second power line on the capacitor layer, the second power line supplying a voltage different from a voltage of the first power line.

15. A display device comprising:
    a base layer;
    a pixel circuit layer on the base layer, the pixel circuit layer comprising a pixel circuit; and
    a light emitting layer on the pixel circuit layer, the light emitting layer comprising a light emitting element electrically connected to the pixel circuit,
    wherein the pixel circuit layer comprises:
        a first layer comprising a first transistor on the base layer and an intermediate conductive layer comprising a data line and a first power line, the data and first power lines being on the first transistor;
        a second layer sharing the intermediate conductive layer in common with the first layer, portions of the second layer being on the first layer and comprising a second transistor; and
        a capacitor layer on the second layer,
    wherein the first transistor comprises a silicon semiconductor, and the second transistor comprises an oxide semiconductor,
    wherein the data line and the first power line are at a same layer, and
    wherein the second transistor comprises a gate electrode above the oxide semiconductor and a back gate electrode below the oxide semiconductor and within the intermediate conductive layer.

16. The display device of claim 15, wherein the second transistor comprises a gate electrode and an active layer, and
wherein the gate electrode of the second transistor is a back gate electrode under the active layer of the second transistor.

17. The display device of claim 15, wherein the intermediate conductive layer is formed in a same process.

18. The display device of claim 15, wherein the pixel circuit layer further comprises a second power line comprises on the capacitor layer, the second power line supplying a voltage different from a voltage of the first power line, and
wherein the second power line is electrically connected to the capacitor layer and the light emitting element.

19. An electronic device comprising:
a light emitting element;
a pixel circuit electrically connected to the light emitting element;
a first power line electrically connected to the pixel circuit;
a second power line electrically connected to the light emitting element;
an emission control line electrically connected to the pixel circuit;
a scan line electrically connected to the pixel circuit; and
a data line electrically connected to the pixel circuit,
wherein the pixel circuit comprises:
   a first transistor electrically connected to an anode electrode of the light emitting element and the first power line;
   a second transistor electrically connected to the data line and a first node;
   a first capacitor electrically connected to a gate electrode of the first transistor;
   a second capacitor electrically connected to the first transistor and the second transistor;
   a third transistor electrically connected to the first transistor and the first node;
   a fourth transistor electrically connected to the anode electrode of the light emitting element and a second node; and
   a fifth transistor electrically connected to the fourth transistor,
wherein the first transistor, the fourth transistor, and the fifth transistor comprise a silicon semiconductor, and
the second transistor and the third transistor comprise an oxide semiconductor,
wherein the first transistor, the fourth transistor, and the fifth transistor are under the second transistor and the third transistor in a plan view direction,
wherein the data line and the first power line are disposed between the first transistor and the second transistor, and
wherein the first power line and the data line are at a same layer.

20. The electronic device of claim 19, wherein the first transistor, the fourth transistor, and the fifth transistor are at a same layer,
wherein the second transistor and the third transistor are at a same layer,
wherein the first power line and the data line are between a layer at which the first transistor, the fourth transistor, and the fifth transistor are positioned, and a layer at which the second transistor and the third transistor are positioned,
wherein the first capacitor and the second capacitor are on the second transistor and the third transistor, and
wherein the second power line is on the first capacitor and the second capacitor.

* * * * *